(12) United States Patent
Hsu et al.

(10) Patent No.: US 10,779,397 B1
(45) Date of Patent: Sep. 15, 2020

(54) CIRCUIT BOARD STRUCTURE AND LAYOUT STRUCTURE THEREOF

(71) Applicant: Wistron Corporation, New Taipei (TW)

(72) Inventors: Yun-Hsiu Hsu, New Taipei (TW); Ching-Hung Su, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/592,738

(22) Filed: Oct. 3, 2019

(30) Foreign Application Priority Data

Jul. 25, 2019 (TW) .............................. 108126373 A

(51) Int. Cl.
*H05K 1/02* (2006.01)
*H05K 1/18* (2006.01)
*H01L 23/528* (2006.01)

(52) U.S. Cl.
CPC ....... *H05K 1/0265* (2013.01); *H01L 23/5286* (2013.01); *H05K 1/0284* (2013.01); *H05K 1/181* (2013.01)

(58) Field of Classification Search
CPC .. H05K 1/0284; H05K 1/0286; H05K 1/0287; H05K 1/0289; H05K 1/029; H05K 1/0292; H05K 1/0293; H05K 1/0295; H05K 1/0296
See application file for complete search history.

(56) References Cited

U.S. PATENT DOCUMENTS

| | | | |
|---|---|---|---|
| 5,969,421 | A | 10/1999 | Smooha |
| 6,420,662 | B1 | 7/2002 | Ishikawa |
| 2011/0228503 | A1 | 9/2011 | Lu |
| 2016/0360613 | A1* | 12/2016 | Kho ............... H05K 1/0286 |

FOREIGN PATENT DOCUMENTS

WO     2013188712     12/2013

OTHER PUBLICATIONS

"Search Report of Europe Counterpart Application", dated Jun. 9, 2020, p. 1-p. 9.

* cited by examiner

*Primary Examiner* — Jeremy C Norris
(74) *Attorney, Agent, or Firm* — JCIPRNET

(57) ABSTRACT

A circuit board structure and a layout structure thereof are provided. The layout structure is disposed on a circuit board. The layout structure includes a conductive layer, a first connection area, a second connection layer and at least one external conductive wire. The conductive layer is used to form a power rail. The first connection area and the second connection area are respectively disposed on two terminals of the power rail. The external conductive wire is electrically connected between the first connection area and the second connection area, and is coupled with the power rail in parallel.

20 Claims, 9 Drawing Sheets

CIRCUIT BOARD STRUCTURE AND LAYOUT STRUCTURE THEREOF

CROSS-REFERENCE TO RELATED APPLICATION

This application claims the priority benefit of Taiwan application serial no. 108126373, filed on Jul. 25, 2019. The entirety of the above-mentioned patent application is hereby incorporated by reference herein and made a part of this specification.

TECHNICAL FIELD

The invention relates to a circuit board structure and a layout structure thereof, and more particularly, relates to a circuit board structure that can pass a ground protection current test and a layout structure thereof.

BACKGROUND

With advancements in electronic technologies, electronic products have become a necessary tool in people's lives. Accordingly, the safety of electronic products has become a very important issue.

In the European Union's officially published regulation IEC/EN 62368-1, a ground conductive wire (conductor) of a socket that receives the AC power supply needs to withstand a short circuit current of 1500 A. For most electrical conductors, the resistance has a finite positive value and the power is dissipated in form of thermal energy. In order to avoid melting or burning the ground conductive wire of the socket due to overheating, a current density that the ground conductive wire can withstand needs to be maintained below a sufficiently high threshold. However, how to effectively design a layout for power rails in the limited space on the circuit board becomes an important issue to be addressed.

SUMMARY

The invention provides a circuit board structure and a layout structure capable of effectively reducing a passed current density to maintain the safety of the device.

The layout structure of the invention is disposed on a circuit board. The layout structure includes a conductive layer, a first connection area, a second connection layer and at least one external conductive wire. The conductive layer is used to form a power rail. The first connection area and the second connection area are respectively disposed on two terminals of the power rail. The external conductive wire is electrically connected between the first connection area and the second connection area, and is coupled with the power rail in parallel.

In an embodiment of the invention, the first connection area includes a plurality of first solder joints. The first solder joints are in contact with each other. The second connection area has a plurality of second solder joints. The second solder joints are in contact with each other. The external conductive wire is electrically connected between the first solder joints and the second solder joints.

In an embodiment of the invention, the layout structure further includes at least one relay connection area. The relay connection area is disposed on the power rail and disposed between the first connection area and the second connection area. The external conductive wire includes a plurality of external sub conductive wires. Among them, the external sub conductive wires of a first portion are electrically connected between the relay connection area and the first connection area; the external sub conductive wires of a second portion are electrically connected between the relay connection area and the second connection area.

In an embodiment of the invention, the at least one relay connection area includes a plurality of relay solder joint. The relay solder joints are in contact with each other and used to electrically connect the external sub conductive wires.

In an embodiment of the invention, the layout structure further includes a solder mask layer. The solder mask layer covers a portion of the power rail and exposes the relay solder joints.

In an embodiment of the invention, the power rail includes a plurality of segments, and the segments respectively extend along a plurality of directions.

In an embodiment of the invention, each of the at least one relay connection area is disposed on a connection location of the adjacent segments.

In an embodiment of the invention, the power rail further includes a third connection area and a fourth connection area. The third connection area is electrically connected to a power receiving terminal of a power receiver. The fourth connection area electrically receives a power voltage.

In an embodiment of the invention, the power rail further includes a fifth connection area and a sixth connection area. The fifth connection area and the sixth connection area are used to connect an external conductive sheet. The external conductive sheet is electrically connected to the power receiving terminal of the power receiver.

In an embodiment of the invention, the third connection area is disposed between the fifth connection area and the sixth connection area.

In an embodiment of the invention, a section width of the external conductive sheet is not less than 4 mm, and a thickness of the external conductive sheet is not less than 0.3 mm.

In an embodiment of the present invention, the power voltage is a reference ground voltage.

A circuit board structure of the invention includes at least one layout structure described above.

Based on the above, in the layout structure on the circuit board provided by the invention, the connection area for connecting the external conductive wires are disposed on two terminals of the power rail, and the external conductive wires are coupled with the power rail in parallel. In this way, current that flows through the power rail can be divided to the external conductive wires at the same time so the current density on the power rail can be reduced to ensure that the power rail is prevented from damage due to high temperature.

To make the aforementioned more comprehensible, several embodiments accompanied with drawings are described in detail as follows.

DETAILED DESCRIPTION

Figure 1:
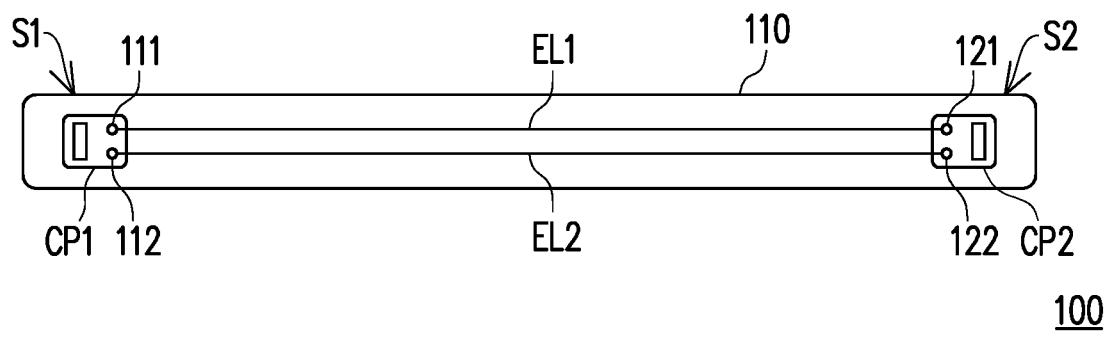
FIG. 1 illustrates a schematic diagram of a layout structure in an embodiment of the invention.

With reference to FIG. 1, FIG. 1 illustrates a schematic diagram of a layout structure in an embodiment of the invention. A layout structure 100 is used to be disposed on a circuit board. The layout structure 100 includes a power rail 110 formed by a conductive layer. The layout structure 100 further includes connection areas CP1 and CP2 and external conductive wires EL1 and EL2. In this embodiment, the connection areas CP1 and CP2 are respectively disposed on two opposite terminals S1 and S2 of the power rail 110. Further, it should be noted that, extending directions of the external conductive wires EL1 and EL2 are substantially in parallel with an extending direction of the power rail 110 and in parallel with a current flowing direction on the power rail 110.

In this embodiment, when current flows on the power rail 110, the external leads EL1 and EL2 coupled with the power rail 110 in parallel can be used for dividing current and reducing the current density on the power rail 110. Accordingly, the degree of rise of the temperature of the power rail 110 can be lowered to ensure the safety of the power rail 110.

On the other hand, in this embodiment, the connection area CP1 has a plurality of solder joints 111 and 112, and the connection area CP2 has a plurality of solder joints 121 and 122. The solder joint 111 and the solder joint 112 are in contact with each other, and the solder joint 121 and the solder joint 122 are in contact with each other. Further, a distribution area of the solder joints 111 and 112 in contact with each other and a distribution area of the solder joints 121 and 122 are not covered by a solder mask layer (green paint) on the circuit board. Therefore, during a component soldering operation of the circuit board, a solder material can be disposed on the distribution area of the solder joints 111 and 112 and the distribution area of the solder joints 121 and 122 for current to flow.

In this embodiment of the invention, the connection area CP2 can be used to couple to a power receiving terminal of a power receiver, and the connection area CP1 can be used to couple to a power voltage. In this way, the power rail 110 can provide a current flowing path between the power voltage and the power receiving terminal of the power receiver. In an embodiment of the invention, the power receiver may be a power socket, and the power receiving terminal may be a reference ground terminal of the power socket. In addition, the power voltage received by the connection area CP1 may be a reference ground voltage.

It is worth mentioning that the number of the solder joints included in the connection areas CP1 and CP2 is not limited. The solder joints 111, 112, 121, and 122 illustrated in FIG. 1 are merely illustrative examples and are not intended to limit the scope of the invention.

In addition, in the embodiment of the invention, the number of the external conductive wires may be one or more. The designer can adjust the number of external conductive wires according to a maximum current that the power rail 110 needs to withstand without particular limitations. In FIG. 1, the external conductive wire EL1 can be soldered between the solder joints 111 and 121, and the external conductive wire EL2 can be soldered between the solder joints 112 and 122. The external conductive wires EL1 and EL2 can be disposed together on the circuit board during an electronic component plug-in operation of the circuit board without an additional processing.

Figure 2:
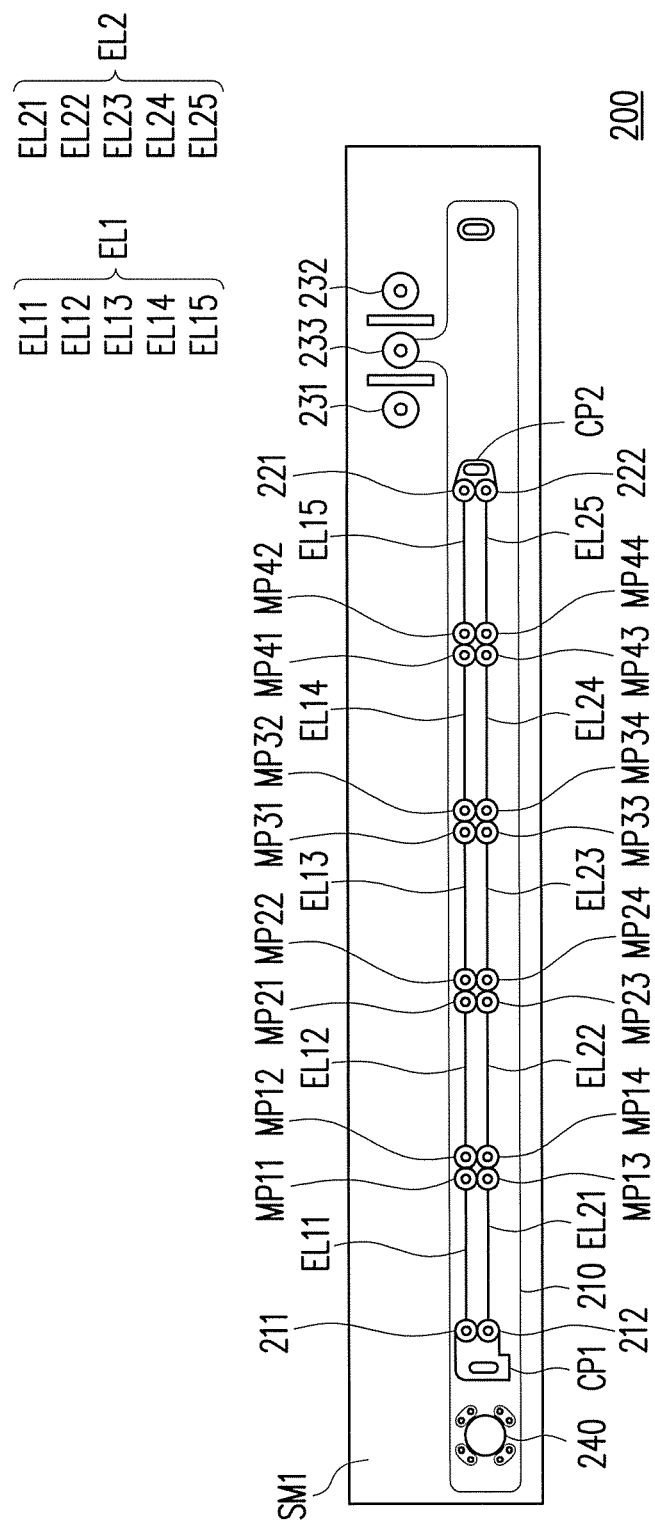
FIG. 2 illustrates a schematic diagram of a layout structure in another embodiment of the invention.

With reference to FIG. 2, FIG. 2 illustrates a schematic diagram of a layout structure in another embodiment of the invention. A layout structure 200 includes a power rail 210 formed by a conductive layer, an external conductive wire EL1 formed by a plurality of external sub conductive wires EL11 to EL15, an external conductive wire EL2 formed by a plurality of external sub conductive wires EL21 to EL25, connection areas CP and CP2 and a plurality of relay connection areas formed by a plurality of relay solder joints MP11 to MP14, MP21 to MP24, MP31 to MP34 and MP41 to MP44, respectively.

In this embodiment, the connection area CP1 has solder joints 211 and 212 in contact with each other, and the connection area CP2 has solder joints 221 and 222 in contact with each other. Further, a first relay connection area is formed by the relay solder joints MP11 to MP14 in contact with each other; a second relay connection area is formed by the relay solder joints MP21 to MP24 in contact with each other; a third relay connection area is formed by the relay solder joints MP31 to MP34 in contact with each other; a fourth relay connection area may be formed by the relay solder joints MP41 to MP44 in contact with each other. The external sub conductive wires EL11 to EL15 and EL21 to EL25 can be sequentially coupled between two adjacent relay connection areas, respectively.

Here, it should be noted that in this embodiment, surfaces of the solder joints 211, 212, 221, and 222 and the relay solder joints MP11 to MP44 are not covered by solder mask layer on the circuit board. Therefore, by disposing the solder material on distribution areas of the solder joints 211 and 212 and the relay solder joints MP11 to MP44, a current venting ability that the layout structure 200 can provide can be improved to reduce the possibility of damage to the layout structure 200.

It is worth mentioning that in this embodiment, the four relay solder joints MP11 to MP14, MP21 to MP24, MP31 to MP34 and MP41 to MP44 respectively included by each of the relay connection areas are merely illustrative examples. In other embodiments of the invention, the number of the relay solder joints included by each of the relay connection areas may be adjusted according to actual needs without particular limitations.

In addition, the layout structure 200 can include a connection area 240. The connection area 240 is disposed on the power rail 210. The connection area 240 is provided with a fixing hole to provide a locking component (e.g., a screw, not shown) to lock the layout structure 200 to a reference ground power.

Figure 3A:
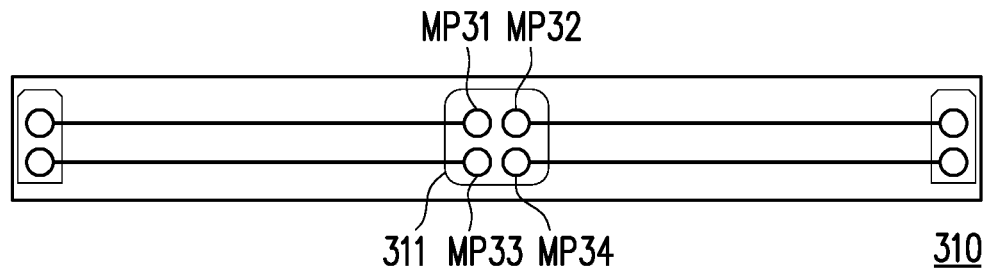
FIG. 3A to FIG. 3D respectively illustrate schematic diagrams of different implementations of a relay connection area in the embodiments of the invention.
Figure 3B:
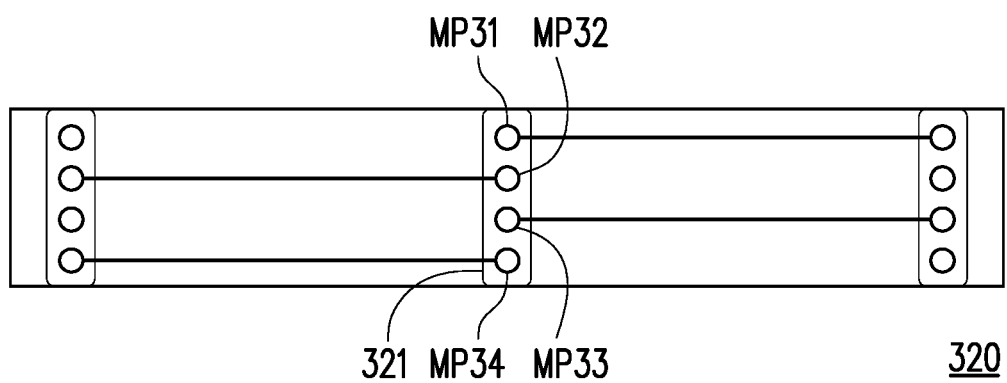

Here, with reference to FIG. 3A to FIG. 3D, FIG. 3A to FIG. 3D respectively illustrate schematic diagrams of different implementations of a relay connection area in the embodiments of the invention. In FIG. 3A, a layout structure 310 has a relay connection area 311. The relay connection area 311 has relay solder joints MP31 to MP34. The relay solder joints MP31 to MP34 are in contact with each other and arranged in a 2×2 matrix manner. In FIG. 3B, a layout structure 320 has a relay connection area 321. The relay connection area 321 has relay solder joints MP31 to MP34. The relay solder joints MP31 to MP34 are in contact with each other and arranged in a 4×1 matrix manner.

Figure 3C:
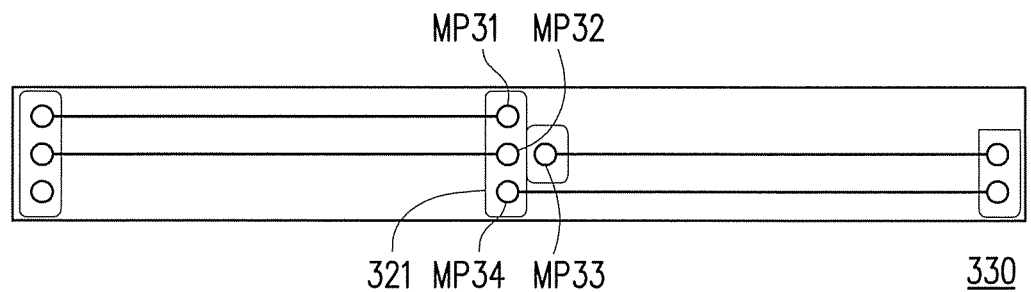

On the other hand, in FIG. 3C, in a relay connection area 331 in a layout structure 330, the relay solder joints MP31 to MP34 can be arranged in an irregular manner. The important point is that the relay solder joints MP31 to MP34 need to be in contact with each other and provide an area. Accordingly, when current flows through the relay connection area 331, by disposing the solder material on the relay connection area 331, the current density can be effectively reduced.

Figure 3D:
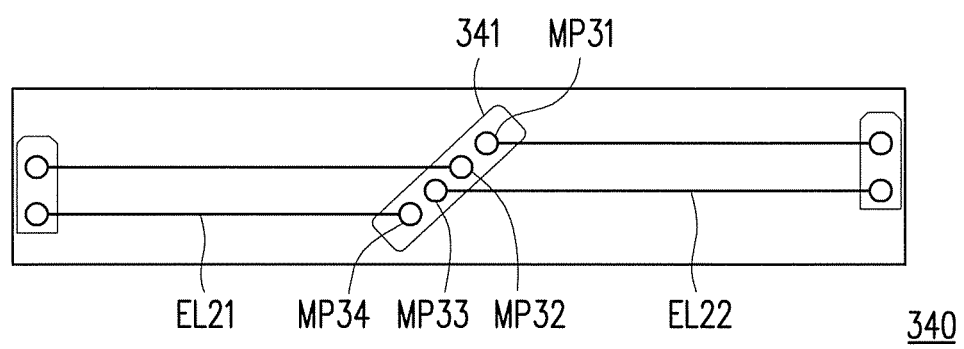

Moreover, in FIG. 3D, a layout structure 340 includes a relay connection area 341. The relay connection area 341 has relay solder joints MP31 to MP34. The relay solder joints MP31 to MP34 are in contact with each other, and arranged in such a manner as to have an oblique angle with the external sub conductive wires EL21 and EL22.

Figure 4A:
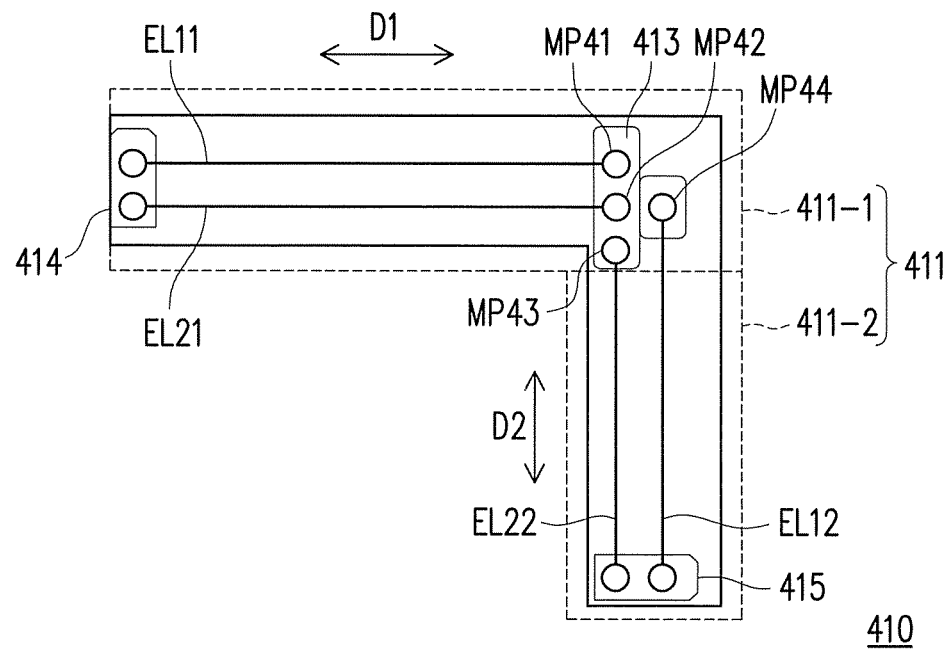
FIG. 4A and FIG. 4B respectively illustrate schematic diagrams of the layout structures in different embodiments of the invention.
Figure 4B:
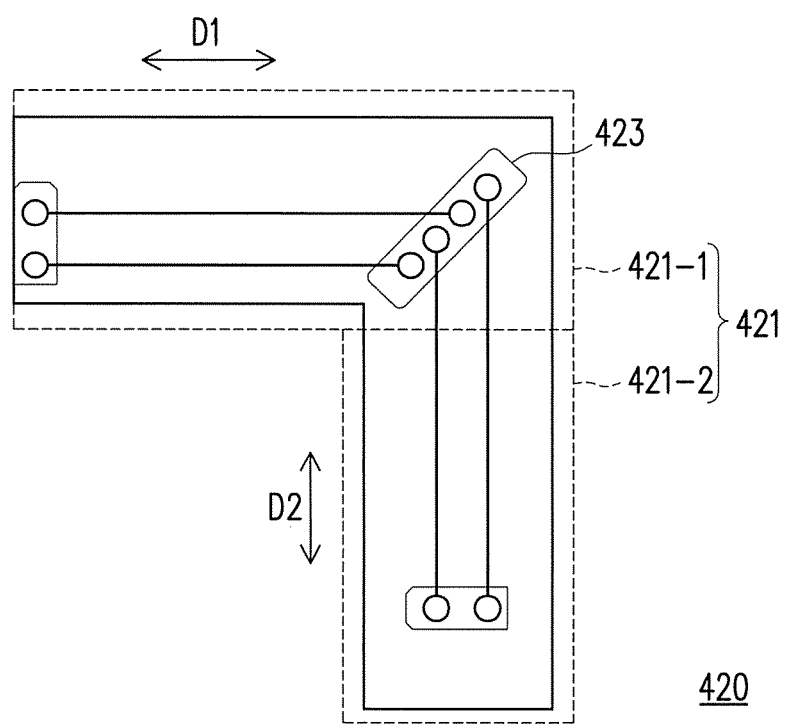

The following refers to FIG. 4A and FIG. 4B, and FIG. 4A and FIG. 4B respectively illustrate schematic diagrams of the layout structures in different embodiments of the invention In FIG. 4A, a layout structure 410 includes a voltage rail 411 formed by a conductive layer. The power rail 411 includes a first segment 411-1 and a second 411-2. The first segment 411-1 and the second segment 411-2 are in contact with each other, and extending along directions D1 and D2, respectively. The direction D1 and the direction D2 may be orthogonal or may not be orthogonal to each other. In addition, a relay connection area 414 is disposed on the voltages rail 411. The relay connection area 414 is disposed on a connection location of the first segment 411-1 and the second segment 411-2. The relay connection area 414 has a plurality of relay solder joints MP41 to MP44. The relay solder joints MP41 to MP44 can be arranged according to the manner shown in FIG. 3C. The relay solder joints MP41 to MP44 are in contact with each other.

The layout structure 410 further includes external sub conductive wires EL11, EL21, EL12 and EL22. Among them, the external sub conductive wires EL11 and EL21 of a first portion are disposed on the first segment 411-1 of the power rail 411, and electrically connected between a connection portion 414 and the relay connection area 413. The external sub conductive wires EL12 and EL22 of a second portion are disposed on the second segment 411-2 of the power rail 411, and electrically connected between a connection portion 415 and the relay connection area 413.

It is worth mentioning that, the layout structure 410 of the invention may also have more than two segments. One or more segments may be disposed on the layout structure 410 depending on the actual state of the layout area without particular limitations.

In FIG. 4B, a layout structure 420 includes a voltage rail 421 formed by a conductive layer. The power rail 421 includes a first segment 421-1 and a second 421-2. The first segment 421-1 and the second segment 421-2 are in contact with each other, and extending along directions D1 and D2, respectively. The direction D1 and the direction D2 may be orthogonal or may not be orthogonal to each other. In addition, a relay connection area 423 is disposed on the power rail 421. Unlike the foregoing embodiment, the relay solder joints in the relay connection area 423 are arranged by adopting the manner shown by FIG. 3D. It is worth mentioning that, the relay solder joints in the relay connection area 423 may also be arranged by adopting the manner shown by FIG. 3A or FIG. 3B without particular limitations.

Figure 5:
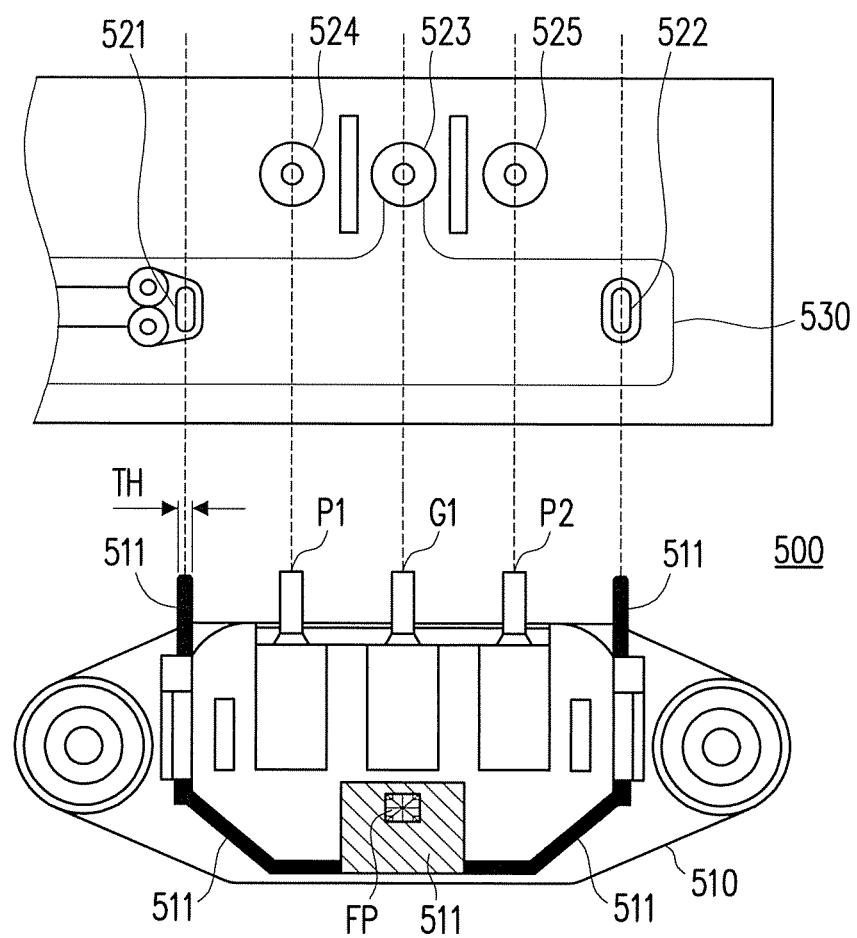
FIG. 5 illustrates a schematic diagram of a layout structure in another embodiment of the invention.

With reference to FIG. 5, FIG. 5 illustrates a schematic diagram of a layout structure in another embodiment of the invention. In FIG. 5, a layout structure 500 is used to connect a power receiver 510. Here, the power receiver 510 may be a power socket.

In this embodiment, the layout structure 500 additionally includes connection areas 521 to 525. Among them, the connection areas 521 and 522 are disposed on a power rail 530; the connection areas 523, 524 and 525 are disposed on a lateral side of the power rail 530; and the connection area 523 is electrically connected to the power rail 530. Here, it should be noted that, the connection areas 521 to 525 are used to connect the power receiver 510. The connection areas 523 to 525 are used to connect a plurality of power receiving terminals G1, P1 and P2 of the power receiver 510, respectively. Among them, the power receiving terminal G1 may be a ground pin, and the power receiving terminals P1 and P2 may be a fire wire power pin and a neutral wire power pin, respectively.

Here, it should be noted that, the layout structure 500 further includes an external conductive sheet 511. The external conductive sheet 511 is disposed on the power receiver 510, fixed onto the power receiver 510 through a locking piece FP, and electrically connected to the power receiving terminal G1 of the power receiver 510. The external conductive sheet 511 is electrically connected to the power rail 530 through the connection areas 521 and 522.

Figure 6A:
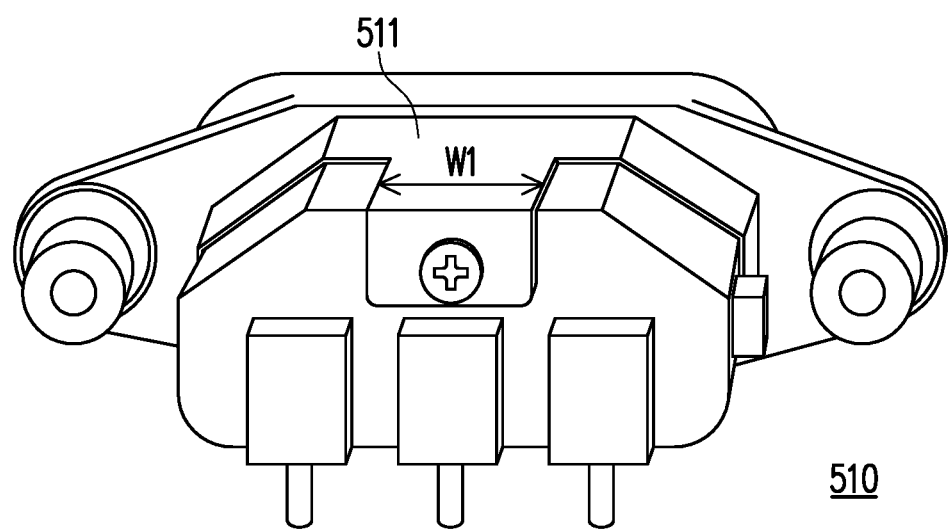
FIG. 6A illustrates a schematic diagram of a power receiver in an embodiment of the invention.
Figure 6B:
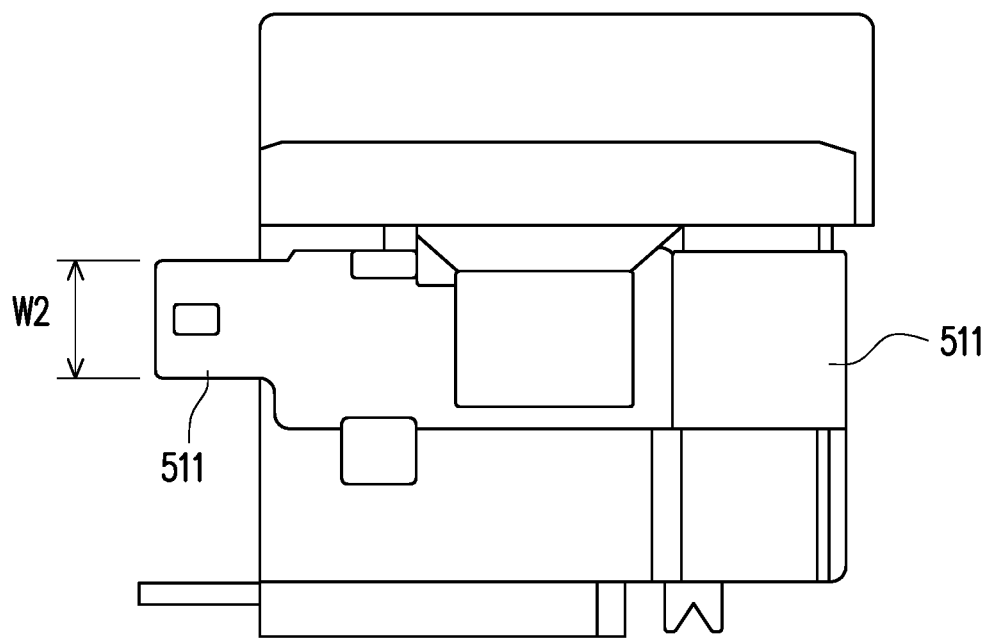
FIG. 6B illustrates a side view of the power receiver in an embodiment of the invention.

A perspective view of the power receiver 510 may refer to a schematic diagram of the power receiver of the embodiment of the invention illustrated in FIG. 6A and a side view of the power receiver of the embodiment of the invention illustrated in FIG. 6B.

It should be noted that in FIG. 6A, the embodiment of the invention can increase a current flow rate by increasing a size of the external conductive sheet 511, and thereby reduce the current density that may be generated on the external conductive sheet 511. In the embodiment of the invention, a section width W1 of the external conductive sheet 511 is not less than 4 mm, and a thickness TH of the external conductive sheet 511 is not less than 0.3 mm.

Further, in FIG. 6B, the external conductive sheet 511 has a section width W2 at a portion connected to the layout structure 500. The section width W2 is not less than 3 mm.

Figure 7:
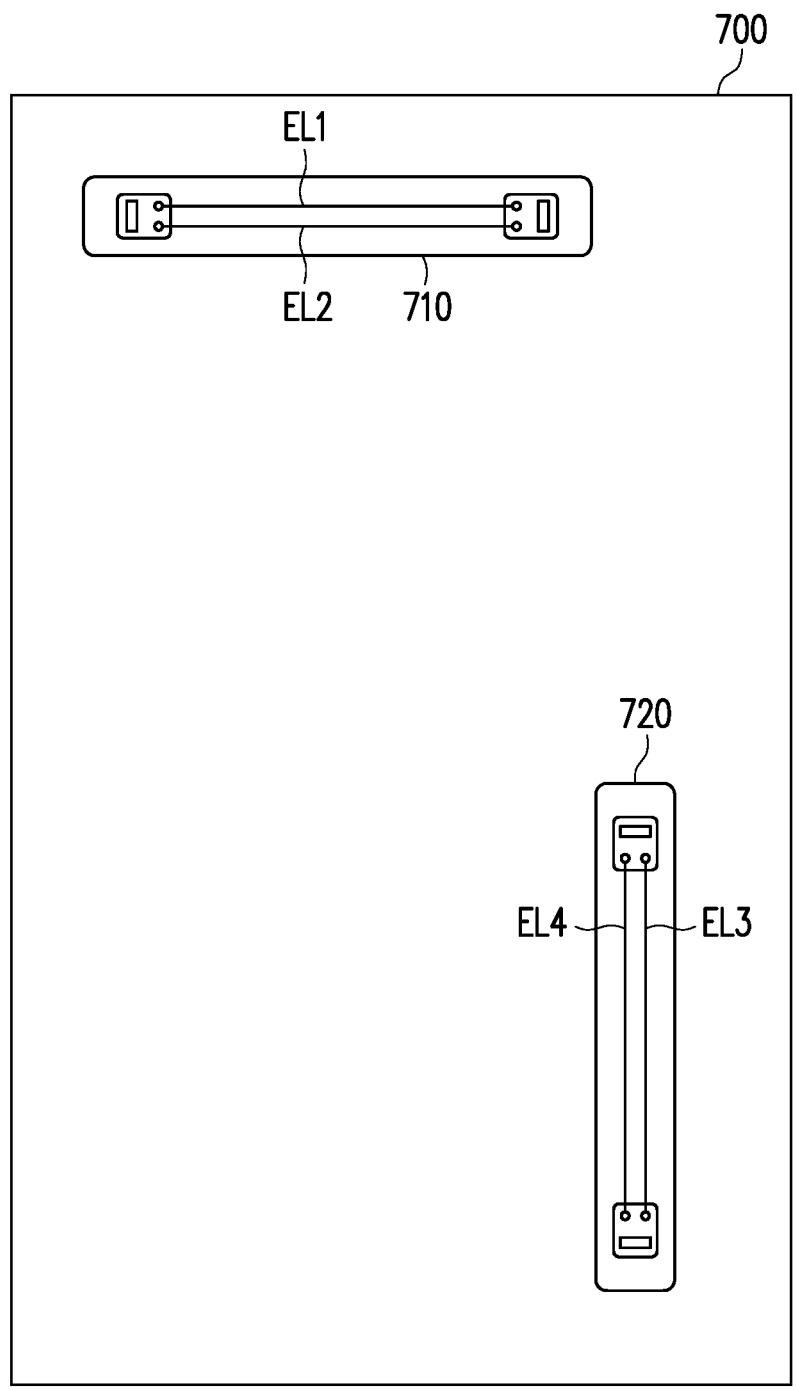
FIG. 7 illustrates a schematic diagram of a circuit board structure in an embodiment of the invention.

With reference to FIG. 7, FIG. 7 illustrates a schematic diagram of a circuit board structure in an embodiment of the invention. A circuit board structure 700 may be a printed-circuit board, and may include one or more layout structures 710 and 720. The layout structures 710 and 720 are similar to the layout structures of the foregoing embodiments and are thus not repeated hereinafter.

It should be noted that in this embodiment, external conductive wires EL1, EL2, EL3 and EL4 respectively included by the layout structures 710 and 720 may be disposed on a first surface of the circuit board structure 700 and may also be disposed on a second surface of the circuit board structure 700, wherein the first surface is opposite to the second surface. It should be noted that in this embodiment, the external conductive wires EL1, EL2, EL3 and EL4 may all be disposed on the same surface of the circuit board structure 700 or disposed on different surfaces of the circuit board structure 700 without particular limitations.

The layout structures 710 and 720 of this embodiment of the invention may be used to connect to the same power receiver, or connect to different power receivers, respectively.

By disposing the external conductive wires EL1, EL2, EL3 and EL4, the layout structures 710 and 720 can provide the current venting ability that allows the circuit board structure 700 to be compliance with regulatory requirements.

In summary, the present invention can increase a cross-sectional area for current to pass in the layout structure by disposing the external conductive wires on the power rail in the layout structure. As a result, the current density on the power rail can be reduced so the risk of damage to the power rail due to high current density can be reduced.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A layout structure, disposed on a circuit board, comprising
   a conductive layer used to form a power rail;
   a first connection area and a second connection area respectively disposed on two opposite terminals of the power rail; and
   at least one external conductive wire having two opposite ends being respectively electrically connected to the first connection area and the second connection area, wherein the at least one external conductive wire is coupled with the power rail in parallel.

2. The layout structure according to claim 1, wherein the first connection area has a plurality of first solder joints; the first solder joints are in contact with each other; the second connection area has a plurality of second solder joints; the second solder joints are in contact with each other; the at least one external conductive wire is electrically connected between the first solder joints and the second solder joints.

3. The layout structure according to claim 1, further comprising: at least one relay connection area, the at least one relay connection area being disposed on the power rail and disposed between the first connection area and the second connection area, the at least one external conductive wire comprising a plurality of external sub conductive wires,
   wherein the external sub conductive wires of a first portion are electrically connected between the at least one relay connection area and the first connection area; the external sub conductive wires of a second portion are electrically connected between the at least one relay connection area and the second connection area.

4. The layout structure according to claim 3, wherein the at least one relay connection area comprises a plurality of relay solder joints, the relay solder joints being in contact with each other and used to electrically connect the external sub conductive wires.

5. The layout structure according to claim 4, further comprising:
   a solder mask layer covering a portion of the power rail and exposing the relay solder joints.

6. The layout structure according to claim 5, wherein the power rail comprises a plurality of segments, the segments respectively extending along a plurality of directions.

7. The layout structure according to claim 6, wherein each of the at least one relay connection area is disposed on a connection location of the adjacent segments.

8. The layout structure according to claim 1, wherein the power rail further comprises a third connection area and a fourth connection area,
   wherein the third connection area is electrically connected to a power receiving terminal of a power receiver; the fourth connection area electrically receives a power voltage.

9. The layout structure according to claim 8, wherein the power rail further comprises a fifth connection area and a sixth connection area; the fifth connection area and the sixth connection area are used to connect an external conductive sheet; the external conductive sheet is electrically connected to the power receiving terminal of the power receiver.

10. The layout structure according to claim 9, wherein the third connection area is disposed between the fifth connection area and the sixth connection area.

11. The layout structure according to claim 9, wherein a section width of the external conductive sheet is not less than 4 mm; a thickness of the external conductive sheet is not less than 0.3 mm; a section width of a connection portion of the external conductive sheet with each of the fifth connection area and the sixth connection area is not less than 3 mm.

12. The layout structure according to claim 9, wherein the power voltage is a reference ground voltage.

13. A circuit board structure, comprising:
   at least one layout structure, comprising:
      a conductive layer used to form a power rail;
      a first connection area and a second connection area respectively disposed on two opposite terminals of the power rail; and
      at least one external conductive wire having two opposite ends being respectively electrically connected to the first connection area and the second connection area wherein the at least one external conductive wire is coupled with the power rail in parallel.

14. The circuit board structure according to claim 13, wherein the first connection area has a plurality of first solder joints; the first solder joints are in contact with each other; the second connection area has a plurality of second solder joints; the second solder joints are in contact with each other; the at least one external conductive wire is electrically connected between the first solder joints and the second solder joints.

15. The circuit board structure according to claim 13, wherein the layout structure further comprises at least one relay connection area, the at least one relay connection area being disposed on the power rail and disposed between the first connection area and the second connection area, the at least one external conductive wire comprising a plurality of external sub conductive wires,
   wherein the external sub conductive wires of a first portion are electrically connected between the at least one relay connection area and the first connection area; the external sub conductive wires of a second portion are electrically connected between the at least one relay connection area and the second connection area.

16. The circuit board structure according to claim 15, wherein the at least one relay connection area comprises a plurality of relay solder joints, the relay solder joints being in contact with each other and used to electrically connect the external sub conductive wires.

17. The circuit board structure according to claim 16, further comprising: a solder mask layer, wherein the solder mask layer covers a portion of the power rail and exposes the relay solder joints.

18. The circuit board structure according to claim 17, wherein the power rail further comprises a third connection area and a fourth connection area,
   wherein the third connection area is electrically connected to a power receiving terminal of a power receiver; the fourth connection area electrically receives a power voltage.

19. The circuit board structure according to claim 18, wherein the power rail further comprises a fifth connection area and a sixth connection area; the fifth connection area and the sixth connection area are used to connect an external conductive sheet; the external conductive sheet is electrically connected to the power receiving terminal of the power receiver.

20. The circuit board structure according to claim 19, wherein a section width of the external conductive sheet is not less than 4 mm; a thickness of the external conductive sheet is not less than 0.3 mm; a section width of a connection portion of the external conductive sheet with each of the fifth connection area and the sixth connection area is not less than 3 mm.

\* \* \* \* \*